(12) United States Patent
Patten

(10) Patent No.: US 8,933,366 B2
(45) Date of Patent: Jan. 13, 2015

(54) MICRO LASER ASSISTED MACHINING

(75) Inventor: John Patten, Portage, MI (US)

(73) Assignee: Western Michigan University Research Foundation, Kalamazoo, MI (US)

( * ) Notice: Subject to any disclaimer, the term of this patent is extended or adjusted under 35 U.S.C. 154(b) by 1477 days.

(21) Appl. No.: 11/992,811

(22) PCT Filed: Sep. 28, 2005

(86) PCT No.: PCT/US2005/035283
§ 371 (c)(1),
(2), (4) Date: Nov. 18, 2009

(87) PCT Pub. No.: WO2007/040528
PCT Pub. Date: Apr. 12, 2007

(65) Prior Publication Data
US 2010/0065536 A1 Mar. 18, 2010

(51) Int. Cl.
*B23K 26/00* (2014.01)
*B23K 26/36* (2014.01)
*B23K 26/06* (2014.01)
*B23K 26/02* (2014.01)
(Continued)

(52) U.S. Cl.
CPC ........... *B23K 26/367* (2013.01); *B23K 26/0639* (2013.01); *B23K 26/0093* (2013.01); *B23K 26/023* (2013.01); *B23K 26/408* (2013.01); *B23K 2201/40* (2013.01); *B23P 25/006* (2013.01); *H05K 1/0306* (2013.01); *H05K 3/0029* (2013.01); *H05K 2203/0195* (2013.01); *H05K 2203/0271* (2013.01)
USPC ..................................................... 219/121.66

(58) Field of Classification Search
CPC .................................................. B23K 26/0639
USPC ............ 219/78.01, 78.22, 86.23, 221, 121.66
See application file for complete search history.

(56) References Cited

U.S. PATENT DOCUMENTS 4,229,640 A   10/1980  Longo
4,798,931 A *  1/1989  Hess, III .................. 219/121.64
(Continued)

FOREIGN PATENT DOCUMENTS

DE      4403999 A1    8/1995
FR      2749204 A1   12/1997
(Continued)

OTHER PUBLICATIONS

John Patten et al., "High-pressure phase transformation of silicon nitride", Dec. 8, 2003, Applied Physics Letters, vol. 83, No. 23, pp. 4740-4742.*
(Continued)

Primary Examiner — William D Coleman
(74) Attorney, Agent, or Firm — Price Heneveld LLP

(57) ABSTRACT

A method and apparatus (1) for machining a semiconductor or ceramic workpiece (32) causes a portion of the workpiece to undergo high pressure phase transformation to form a high pressure phase transformation portion which has altered optical properties from the remainder of the workpiece. A laser is irradiated on the high pressure transformation portion to heat the high pressure transformation portion and cause it to soften and then the workpiece is plastically deformed, at smaller loads and forces, along the softened portion in order to accomplish the machining of the workpiece with a machining tool (21).

20 Claims, 2 Drawing Sheets

(51) Int. Cl.
*B23K 26/40* (2014.01)
*B23P 25/00* (2006.01)
*H05K 3/00* (2006.01)
*H05K 1/03* (2006.01)

(56) References Cited

U.S. PATENT DOCUMENTS

| | | | | |
|---|---|---|---|---|
| 6,104,853 | A * | 8/2000 | Miyagi et al. | 385/125 |
| 6,415,639 | B1 * | 7/2002 | Kilian et al. | 72/342.1 |
| 6,525,294 | B1 | 2/2003 | Kipping et al. | |
| 6,776,328 | B2 * | 8/2004 | Rice et al. | 228/112.1 |
| 7,152,776 | B2 * | 12/2006 | Nelson et al. | 228/112.1 |
| 7,216,793 | B2 * | 5/2007 | Stotler et al. | 228/112.1 |
| 2004/0104207 | A1 | 6/2004 | Wu et al. | |

FOREIGN PATENT DOCUMENTS

| | | |
|---|---|---|
| JP | 61152345 A | 7/1986 |
| JP | 02241688 | 9/1990 |

OTHER PUBLICATIONS

K. Colligan, "Material Flow Behavior during Friction Stir Welding of Aluminum", Jul. 1999, American Welding Society, Welding Research Supplement, pp. 229s237s.*

R.S. Mishra et al., "Friction stir welding and processing", Materials Science and Engineering R vol. 50, Aug. 2005, pp. 1-78.*

A. Ozekcin et al., "A Microstructual Study of Friction Stir Welded Joints of Carbon Steels", International Journal of Offshore and Polar Engineering, vol. 14, No. 4, Dec. 2004, pp. 284-288.*

Vali A et al., "Residual Stress Conditions in Laser-Assisted Machining," Welding International, 1999, pp. 296-299, vol. 13, Woodhead Publishing Limited, Cambridgeshire, GB.

Poduraev V N et al., "Laser Machining Tool Equipped with Hard Alloys and Synthetic Superhard Materials," Soviet Engineering Research, Jan. 1991, pp. 40-46, vol. 11, Melton Mowbray, GB.

"Laser Technology Opens up Opportunities for Ceramics," Automotive Engineer, Feb. 1999, p. 22, vol. 24, Professional Engineering Publishing, London, GB.

International Search Report, May 29, 2006, from International Application No. PCT/US2005/035283, 5 pages.

* cited by examiner

MICRO LASER ASSISTED MACHINING

FIELD OF THE INVENTION

The present invention relates to a process for machining or deforming a workpiece in which a laser is used to soften the workpiece while the workpiece material is undergoing a high pressure phase transformation and the high pressure phase transformed portion of the workpiece then is physically softened and deformed.

The present invention also is directed to an apparatus for performing high pressure phase transformation machining of a workpiece which comprises a laser source for generating laser radiation, a machining tool holder, a machining tool capable of transmitting the laser radiation, a force generating means for bringing the machining tool into contact with the workpiece at a pressure of at least the hardness of the workpiece and means for effecting relative movement between the workpiece and the machining tool.

DESCRIPTION OF THE PRIOR ART

Laser-assisted machining of materials which are difficult to work with have recently become very popular. These conventional methods involve the application of heat to a workpiece to cause a softening of the workpiece material and the facilitation of the machining of the workpiece. With these conventional methods, it is necessary that only the portion of the material which is to be removed by the cutting tool be subjected to the heat so that permanent damage does not occur to the remaining material of the workpiece. Plasma tubes have been used to effect the heating of the workpiece material but this type of apparatus is so bulky it does not really permit the localized heating of smaller areas of the material of the workpiece in close proximity to the cutting tool.

Conventional laser-assisted machining also requires that the laser and the machining tool be decoupled, that is, that the laser radiation that heats and softens the workpiece be in advance of the machining tool. This makes the apparatus needed to perform conventional laser-assisted machining very complicated, expensive, and macroscopic in size.

U.S. Pat. No. 4,229,640 discloses a process for machining a workpiece through the use of a cutting tool having a cutting edge and an adjacent leading face which lifts shavings from the workpiece material in which localized heating of the workpiece material about to be removed is accomplished by a laser beam arranged to heat two distinct local areas of the workpiece adjacent to the cutting tool. However, this process and apparatus requires a great deal of energy since macroscopic deformation is achieved at very high temperatures of at least greater than the material's glass transition temperature or above the binder/sintering material's thermal softening point for polycrystalline materials and, as a result, a large laser source and considerable amount of energy (kW) are required.

BRIEF SUMMARY OF THE INVENTION

It is an object of the present invention to provide a method and apparatus for machining a workpiece which performs microscopic deformation of the workpiece by forming high pressure phase transformation of a portion of the workpiece while exposing this portion of the workpiece to irradiation by a laser.

DETAILED DESCRIPTION OF THE INVENTION

Figure 1:
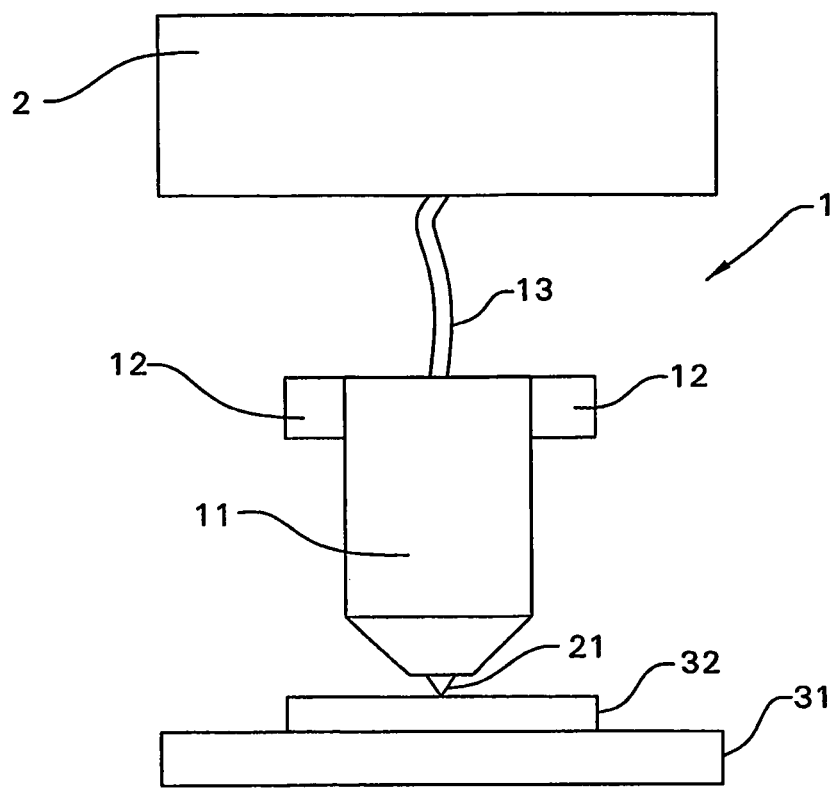
FIG. 1 illustrates an apparatus for performing micro-laser assisted high pressure phase transformation machining of a workpiece according to the present invention.

Under normal conditions, semiconductor and ceramic materials are hard and brittle and do not readily plastically deform. Macroscopic deformation of these materials can only be achieved at very high temperatures. Conventional laser-assisted machining allows macroscopic deformations by heating the workpiece to a temperature greater than the glass transition temperature of the material of the work, or above the thermal softening temperature of the binder (sintering agent) material. At size scales of micrometers to millimeters, brittle fracture of semiconductor and ceramic materials tends to dominate over a ductile or plastic response because it requires less energy to generate and propagate a crack than what it requires to plastically deform a volume of material. Ductile or plastic response of these nominally brittle materials is confined to small size scales at low temperatures due to the formation of a high pressure transformed phase. The present invention takes advantage of the small size scale ductile plastic response by using a laser to heat preferentially the high pressure phase transformed material of the workpiece.

The drawing shows an apparatus 1 of the present invention for performing micro laser assisted high pressure phase transformation machining of a workpiece. This apparatus comprises a source 2 for generating a laser radiation, a machining tool holder 11, such as a ferrule, a machining tool 21 and a workpiece holder 31. The workpiece 32 of the present invention is made of a material which is transmissible to the wavelength of the laser radiation used in the present invention but forms an opaque or reflective material phase during high pressure phase transformation. That is, in its normal state, the workpiece 32 transmits the laser radiation therethrough but either absorbs or reflects the laser radiation during high pressure phase transformation. The workpiece 32 is preferably made of a semiconductor material, such as silicon or germanium, or a ceramic material, such as silicon nitride or silicon carbon. The material of the workpiece 32 is not critical as long as it is transparent to the wavelength of the laser light used in its normal state and is capable of undergoing high pressure phase transformation to form an opaque or reflective phase.

The source 2 for generating laser light can be any conventional laser radiation generating device that is capable of generating laser radiation having a wavelength of from 1 to 5 microns. Particularly preferred is a laser radiation generating device that is capable of generating infrared laser radiation such as an IR diode.

The present invention is based on the discovery that under extremely high pressures, such as occur at the contact interface between the machining tool 21 and the workpiece 32, semiconductor and ceramic materials transform from covalent and/or ionic bonded structures to high pressure phase transformed metallic structures. It was discovered that these high pressure phase transformed materials had a different crystal structure, such as a β-tin structure, as compared to the structure of the material under normal or low pressure conditions. The pressure needed to form the high pressure phase transformed material was found to be at least equal to the material's hardness. Since the high pressure transformed phase of the workpiece 32 reflects or absorbs the laser radiation while the remainder of the workpiece 32 transmits the laser radiation, the high pressure transformed phase selectively heats and softens while the remainder of the substrate is unaffected. The power range for the source for generating laser radiation is 8 mW-1 kW, with 8 mW-100 W being preferred.

As the machining tool 21, any material which can transmit the desired wavelength of the laser light, is harder than and inert to the substrate and that can be shaped to the desired form can be used. Especially preferred as a material of the machining tool 21 in the present invention is diamond. Since pressure is defined a force per unit area, it is desirable that the tip radius of the machining tool 21 be as small as possible, with a tip radius of from 20 nanometers to 12 microns being preferred. If the tip radius of the machining tool 21 is small enough, the translation of the machining tool 21 along the surface of the workpiece 32 can be sufficient to form the high pressure transformation phase on the workpiece 32. Alternatively, external weights, forces or loads 12, can be applied to the machining tool holder to ensure that the tip of the machining tool 21 contacts the workpiece 32 surface at a sufficient pressure, to cause or generate the high pressure phase transformation, and this pressure can be monitored by a load sensor.

Figure 2:
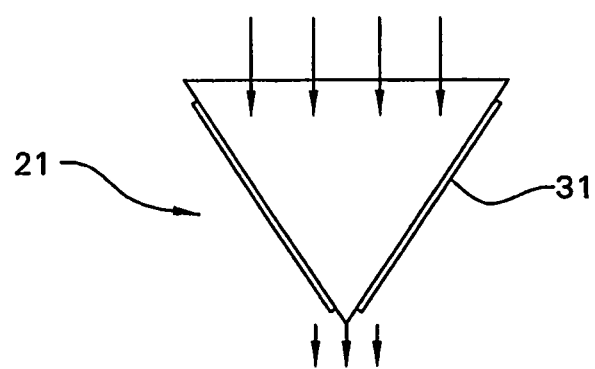
FIG. 2 illustrates a machining tool having a reflective coating provided thereon to focus the laser radiation.
Figure 3:
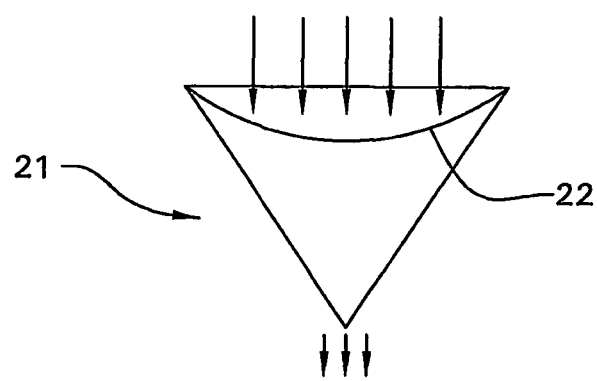
FIG. 3 illustrates a machining tool which utilizes a lens to focus the laser radiation.

In order to help focus the laser radiation, indicated by. the arrows in FIGS. 2 and 3, through the machining tool 21, as shown in FIG. 3, a focusing lens 22 can be provided between the source 2 for generating laser radiation and the machining tool 21 or, as shown in FIG. 2, the machining tool can be coated with a reflective metal 23, such as gold or aluminum.

An adhesive can be used to join the machining tool 21 to the machining tool holder 11 as long as the adhesive is able to adhere to the machining tool 21 and to the machining tool holder 11 and is transparent to the wavelength of the laser light used. The adhesive can be provided around the periphery of the machining tool 11 or at the back end thereof to secure it to the to the machining tool holder 11. An ultraviolet-curable epoxy is preferably used as the adhesive.

If desired, a fiber optic cable 13 can be used for increased flexibility in transmitting the laser radiation from the source 2 to the machining tool 21.

Due to the sharpness of the tip of the machining tool 21, by bringing the machining tool 21 into contact with the surface of the workpiece 32 and effecting relative movement therebetween, a high-pressure phase transformation occurs at the contact point between the machining tool 21 and the workpiece 32.

Relative motion between the machining tool 21 and the workpiece 32 can be accomplished by moving the machining tool 21, a workpiece holder 31, or both relative to each other.

Since the laser light is transmitted through the machining tool 21 to the high pressure transformed phase, the high pressure transformed phase becomes preferentially heated and softens and allows plastic deformation therealong. This enables the apparatus 1 of the present invention to act like a machining tool, such as a lathe, to shape the workpiece 32 and is particularly useful in the optical, semiconductor, and structural ceramic industries. Additionally, since the laser radiation is transmitted through the machining tool 21 as opposed to ahead of it, the machining tool 21 and the laser can be coupled together, which reduces the complexity of the apparatus. Moreover, since only the high pressure transformed phase of the workpiece 32 is heated, a smaller laser source 2 and less energy is required, thereby making the machining procedure more economical.

What is claimed is:

1. A method of deforming a workpiece or removing material from the workpiece, comprising the steps of:
    applying pressure to a surface of the workpiece with a tip of a machining tool to cause a portion of the workpiece to undergo high pressure phase transformation to form a high pressure phase transformation portion having altered optical properties from the remainder of the workpiece;
    irradiating the high pressure phase transformation portion of the workpiece with laser radiation which is transmitted through the machining tool and the remainder of the workpiece and reflected or absorbed by the high pressure phase transformation portion to heat the high pressure phase portion and cause it to soften; and
    plastically deforming the workpiece along the softened high pressure phase transformation portion.

2. The method of claim 1, wherein the workpiece is a semiconductor.

3. The method of claim 1, wherein the workpiece is a ceramic.

4. The method of claim 1, wherein the laser radiation is IR light.

5. The method of claim 1, wherein the tip of the machining tool which causes the portion of the workpiece to undergo high pressure phase transformation is a diamond.

6. The method of claim 1, additionally comprising the step of focusing the laser radiation with a lens.

7. The method of claim 1, wherein the step of applying pressure to a surface of the workpiece includes applying a pressure at least equivalent to the hardness of the workpiece.

8. The method of claim 5, additionally comprising the step of coating at least a portion of the diamond with a gold film to help focus the laser radiation.

9. An apparatus for performing a high pressure phase transformation machining of a workpiece, comprising:
    a machining tool holder;
    a machining tool having a tip;
    a force generating means for bringing the tip of the machining tool into contact with a portion of the workpiece at a pressure of at least the hardness of the workpiece wherein the portion of workpiece contacted with the tip of the machining tool is converted by the pressure of the tip of the machining tool into a high pressure phase transformation portion which has altered optional properties from the remainder of the workpiece;
    a laser source for generating laser radiation which is transmitted through the machining tool to the high pressure phase transformation portion of the workpiece; and
    means for effecting relative movement between the workpiece and the machining tool.

10. The apparatus of claim 9, additionally comprising a means for transmitting the laser radiation from the laser source to the machining tool.

11. The apparatus of claim 9, wherein the machining tool comprises a diamond.

12. The apparatus of claim 9, wherein at least a portion of the machining to coated with a metallic film for focusing the laser radiation.

13. The apparatus of claim 9, wherein a lens is provided between the laser source and the machining tool for focusing the laser radiation.

14. The apparatus of claim 9, additionally comprising a fiber optic cable for transmitting the laser radiation from the laser source to the machining tool.

15. An apparatus for performing high pressure phase transformation machining of a workpiece, comprising:
- a machining tool holder;
- a machining tool utilizing an optically transparent material;
- a machine for bringing the machining tool into contact with a portion of the workpiece at a pressure of at least the hardness of the workpiece to convert the contacted portion of the workpiece into a high pressure phase transformation portion which has altered optical properties from the remainder of the workpiece and effecting relative movement between the workpiece and the machining tool; and
- a source for generating laser radiation which is transmitted through the optically transparent material of the machining tool to the high pressure phase transformation portion of the workpiece.

16. The apparatus for performing high pressure phase transformation machining of claim 15, wherein a port on of the machining tool is coated with a film.

17. The apparatus for performing high pressure phase transformation machining of claim 15, wherein the optically transparent material is a diamond.

18. The apparatus for performing high pressure phase transformation machining of claim 15, wherein a lens is provided between the laser source and the machining tool for focusing the laser radiation at predetermined wavelengths.

19. The apparatus for performing high pressure phase transformation machining of claim 15, wherein the laser is a green laser.

20. The apparatus for performing high pressure phase transformation machining of claim 16, wherein the film is gold.

* * * * *

UNITED STATES PATENT AND TRADEMARK OFFICE
CERTIFICATE OF CORRECTION

PATENT NO. : 8,933,366 B2
APPLICATION NO. : 11/992811
DATED : January 13, 2015
INVENTOR(S) : John Patten Page 1 of 1

It is certified that error appears in the above-identified patent and that said Letters Patent is hereby corrected as shown below:

In the Specification

Column 3, line 25;
  After "by" delete ".".

In the Claims

Column 4, claim 1, line 16;
  After "phase" insert --transformation--.

Column 4, claim 9, line 47;
  "optional" should be --optical--.

Column 4, claim 12, line 60;
  "to" should be --tool is--.

Column 6, claim 16, line 2;
  "port on" should be --portion--.

Signed and Sealed this
Tenth Day of November, 2015

Michelle K. Lee
*Director of the United States Patent and Trademark Office*

UNITED STATES PATENT AND TRADEMARK OFFICE
CERTIFICATE OF CORRECTION

PATENT NO. : 8,933,366 B2  
APPLICATION NO. : 11/992811  
DATED : January 13, 2015  
INVENTOR(S) : John Patten Page 1 of 1

It is certified that error appears in the above-identified patent and that said Letters Patent is hereby corrected as shown below:

In the Specification

On Column 1, Line 2, before the FIELD OF THE INVENTION, please insert the following paragraph:
-- STATEMENT REGARDING FEDERALLY SPONSORED RESEARCH OR DEVELOPMENT
This invention was made with government support under grant number DMB0203552 awarded by the National Institutes of Health. The government has certain rights in the invention. --

Signed and Sealed this
Twentieth Day of August, 2019

Andrei Iancu
*Director of the United States Patent and Trademark Office*